(12) United States Patent
Smith

(10) Patent No.: US 6,781,910 B2
(45) Date of Patent: Aug. 24, 2004

(54) SMALL AREA MAGNETIC MEMORY DEVICES

(75) Inventor: Kenneth Kay Smith, Boise, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/147,597

(22) Filed: May 17, 2002

(65) Prior Publication Data

US 2003/0214838 A1 Nov. 20, 2003

(51) Int. Cl.[7] ................................................. G11C 7/00

(52) U.S. Cl. .................... 365/225.5; 365/171; 365/158; 365/173; 365/189.07

(58) Field of Search ........................... 365/225.5, 158, 365/171, 173, 189.07

(56) References Cited

U.S. PATENT DOCUMENTS

| | | | | |
|---|---|---|---|---|
| 6,097,626 A | * | 8/2000 | Brug et al. | 365/171 |
| 6,215,707 B1 | * | 4/2001 | Moyer | 365/189.07 |
| 6,473,336 B1 | * | 10/2002 | Nakajima et al. | 365/171 |
| 6,490,217 B1 | * | 12/2002 | DeBrosse et al. | 365/225.5 |
| 6,587,370 B2 | * | 7/2003 | Hirai | 365/171 |
| 6,587,371 B1 | * | 7/2003 | Hidaka | 365/173 |
| 2003/0161178 A1 | * | 8/2003 | Tran | 365/158 |

* cited by examiner

*Primary Examiner*—David Nelms
*Assistant Examiner*—Long Tran

(57) ABSTRACT

The present disclosure relates to a magnetic memory device. In one embodiment, the magnetic memory device comprises a plurality of memory cells, and a plurality of write conductors adjacent the memory cells but electrically isolated from the memory cells, at least two of the write conductors being connected to a single shared switch, wherein the write conductors are configured to provide a path for current to flow to thereby generate magnetic fields used to change a state of the memory cells.

19 Claims, 7 Drawing Sheets

SMALL AREA MAGNETIC MEMORY DEVICES

FIELD OF THE INVENTION

The present disclosure relates to memory devices. More particularly, the disclosure relates to magnetic memory devices that have relatively small areas.

BACKGROUND OF THE INVENTION

Magnetic memory such as magnetic random access memory (MRAM) is a non-volatile, semiconductor-based memory technology in which magnetic, rather than electrical, charges are used to store bits of data. In addition to offering non-volatility, magnetic memory devices are very fast and consume little power.

An example of a known magnetic memory device 100 is illustrated in FIG. 1. As shown in this figure, the magnetic memory device 100 comprises a plurality of memory cells or bits 102 that are arranged in a two-dimensional array. A relatively small number of these memory cells 102 have been depicted in FIG. 1 for purposes of explanation. Normally, the magnetic memory device 100 comprises many more such cells 102. For instance, the device 100 may comprise a 1024×1024 array of memory cells 102. Each memory cell 102 is configured to store a single bit of information, i.e., a logic value "1" or a logic value "0."

As is further illustrated in FIG. 1, the magnetic memory device 100 also comprises a plurality of column conductors 104 and row conductors 106 that are electrically coupled to the memory cells 102. Specifically, each memory cell 102 is connected to a column conductor 104 and a row conductor 106 at a cross-point of the conductors. Additionally, the magnetic memory device 100 includes column and row control circuits 108 and 110 which control switching for the various column and row conductors 104 and 106, respectively.

FIG. 2 provides a detailed view of a single memory cell 102 and its connection to its associated column and row conductor 104 and 106. As is evident from FIG. 2, each memory cell 102 typically comprises two magnetic layers 200 and 202 that are separated by a thin insulating layer 204. One of the magnetic layers (e.g., the bottom magnetic layer 202) has a fixed magnetic orientation, while the other magnetic layer (e.g., the top magnetic layer 200) has a "free" magnetic orientation that can be relatively easily toggled from an orientation in which it aligns with the orientation of the fixed magnetic layer to an orientation in which it opposes the orientation of the fixed magnetic layer. The first state (aligned) of the memory cell 102 is called the "parallel" state and the second state (opposed) is called the "anti-parallel" state.

The two different memory cell states can be used to record data due to their disparate effect on resistance of the memory cell 102. Specifically, the memory cell 102 has a relatively small resistance when in the parallel state, but has a relatively high resistance when in the anti-parallel state. By way of example, the parallel state can be designated as representing a logic value "1" while the anti-parallel state can be designated as representing a logic value "0." In such a scheme, the magnetic memory device 100 can be written by changing the magnetic orientation of the free magnetic layer 200 of selected memory cells 102.

The control circuits 108 and 110 are used to facilitate selection of any given memory cell 102 during reading and writing. Normally, these circuits 108, 110 include a plurality of switches, for instance transistors, that are used to apply voltage to or provide current flow through selected conductors. FIG. 3 illustrates a switching arrangement 300 for a magnetic memory device of the type described above in relation to FIGS. 1 and 2. As indicated in FIG. 3, the memory cells are represented as resistors 302 that are electrically coupled to column conductors 304 and row conductors 306. At both ends of each conductor 304, 306 is a read/write transistor 308 that is used to select the various memory cells 302 during reading and writing.

To write data to a memory cell 302, current flow is provided through the column conductor 304 and row conductor 306 associated with a particular memory cell. For instance, if it is desired to write to the upper left memory cell 302 illustrated in FIG. 3, a current is provided to the leftmost column conductor 304 and the topmost row conductor 306 simultaneously. By way of example, the flow of current through the conductors is facilitated by providing a write voltage, $V_{WR}$, to one end of each of the conductors and connecting the opposite end of each conductor to ground via the transistors 308. The magnetic fields created by the flow of electrons through the conductors 304 and 306 cause the orientation of the free layer (e.g., layer 200 in FIG. 2) of the memory cell 302 to change to, therefore, change the state of the cell.

Under one example reading scheme, the conductors 304, 306 associated with each unselected memory cell 302 are provided with a reference voltage, $V_A$, and, simultaneously, one of the conductors associated with a selected memory cell 302 is connected to ground while the other associated conductor is provided with a read voltage, $V_A'$, which has a magnitude similar to the reference voltage, $V_A$. With this configuration, current flows through the selected memory cell 302, and the resistance of the cell can then be determined to, thereby, determine the logic value stored by the cell.

As can be appreciated from the above discussion, a large number of transistors are needed to provide memory cell selectivity in known magnetic memory devices. Specifically, two transistors are needed for each column and row conductor of the device. Stated in another way, 2n transistors are needed for every n conductors in a given layer of the magnetic memory device. In that the conductors in known magnetic memory devices are electrically coupled to the memory cells, the voltage provided to the conductors during writing must be kept relatively low to avoid voltage breakdown of the memory cells. For instance, the voltage across any memory cell cannot exceed approximately 1 volt. In order to limit the voltage across the memory cells, the transistors must be relatively large, for example 100 times larger than that would be necessary if the transistor where only used for reading. Accordingly, known magnetic memory devices require a large number of relatively large transistors. Provision of these transistors increases the amount, i.e. area, of semiconductor material (e.g., silicon) required to fabricate the magnetic memory device and, therefore, significantly increases fabrication costs.

From the above, it can be appreciated that it would be desired to have magnetic memory devices that include control circuitry that requires less area to, thereby, reduce the area required by the magnetic memory devices.

SUMMARY OF THE INVENTION

The present disclosure relates to a magnetic memory device. In one embodiment, the magnetic memory device comprises a plurality of memory cells and a plurality of write conductors adjacent the memory cells but electrically isolated from the memory cells, at least two of the write conductors being connected to a single shared switch, wherein the write conductors are configured to provide a path for current to flow to thereby generate magnetic fields used to change a state of the memory cells.

The present disclosure further relates to a method for writing data to a memory cell of a magnetic memory device. In one embodiment, the method comprises providing a write voltage to a first end of a write conductor of the magnetic memory device with a first transistor, the write conductor being electrically isolated from the memory cell, connecting a second end of the write conductor to ground with a second transistor that is connected to at least one other write conductor of the magnetic memory device to create a first current path and a first magnetic field, and providing a write voltage to a separate conductor also connected to ground to create a second current path and a second magnetic field, wherein the first and second fields together change a state of the memory cell.

BRIEF DESCRIPTION OF THE DRAWINGS

The invention can be better understood with reference to the following drawings. The components in the drawings are not necessarily to scale, emphasis instead being placed upon clearly illustrating the principles of the present invention.

DETAILED DESCRIPTION

As identified above, known cross-point array magnetic memory devices typically include relatively large transistors placed at each end of each conductor used in the memory cell array. Specifically, 2n transistors are typically provided for each n column and row transistors. These transistors require a relatively large area and therefore unduly add to the size and cost of the device.

Disclosed herein are reduced area magnetic memory devices in which one or more additional electrically isolated write conductor layers are provided. With the provision of this or these layer(s), one or more layers of conductors can be used as dedicated read (i.e., bit) conductors to reduce the number of switches (e.g., transistors) within the read layer or layers to n switches for n conductors. In addition, because the bit conductors are only used for reading, the size of the remaining switches can be reduced substantially (e.g., by a factor of 100 or more).

Furthermore, in that the one or more write conductor layers are not electrically coupled to the memory cells of the magnetic memory device, larger voltages may be used and, therefore, smaller switches can be used for switching for the write conductor layer(s). Moreover, two or more of the write conductors can be tied together at one end with a single shared write switch, thereby reducing the number of switches for the write conductors to (n+1) switches for n write conductors. Although the inclusion of one or more write conductor layers adds incrementally to the cost of the magnetic memory devices, this additional cost is far outweighed by the cost savings provided by the reduced size of the switches.

Figure 1:
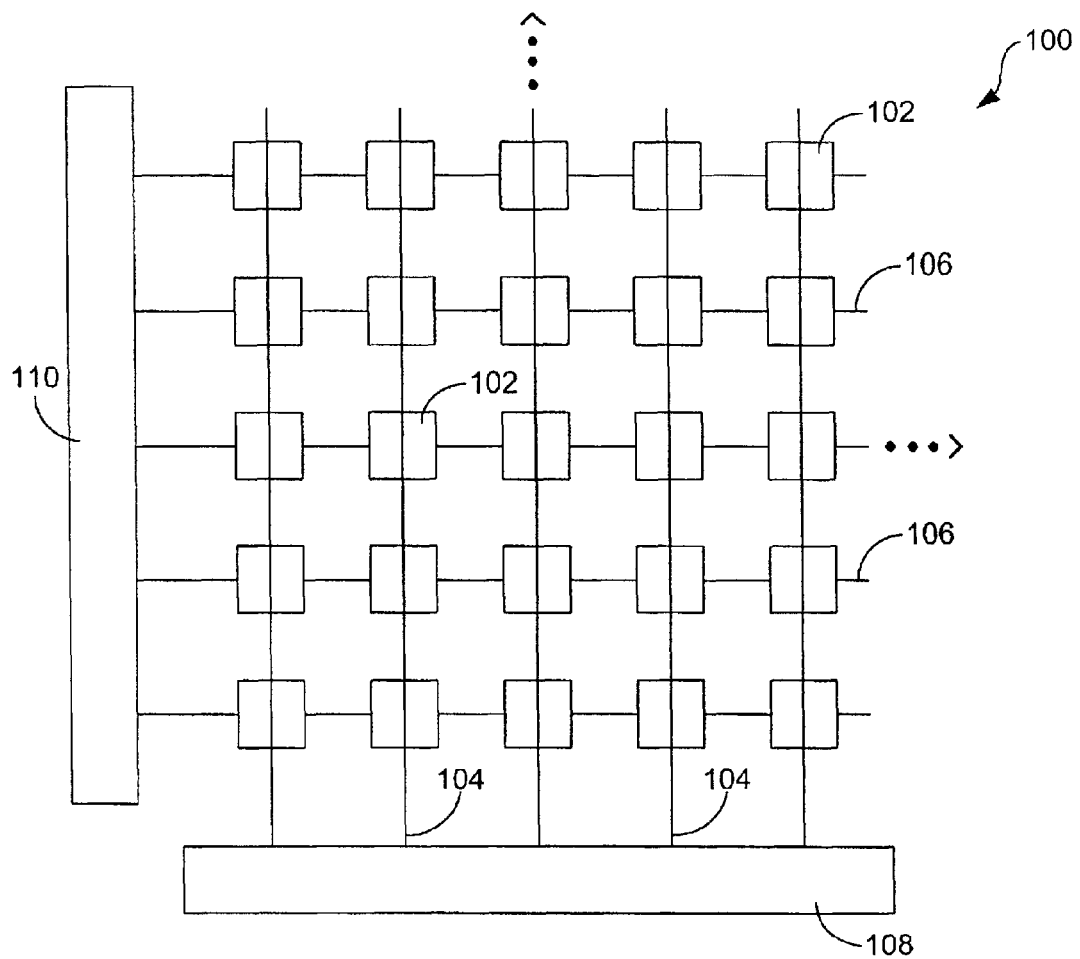
FIG. 1 is schematic plan view of a known magnetic memory device.
Figure 2:
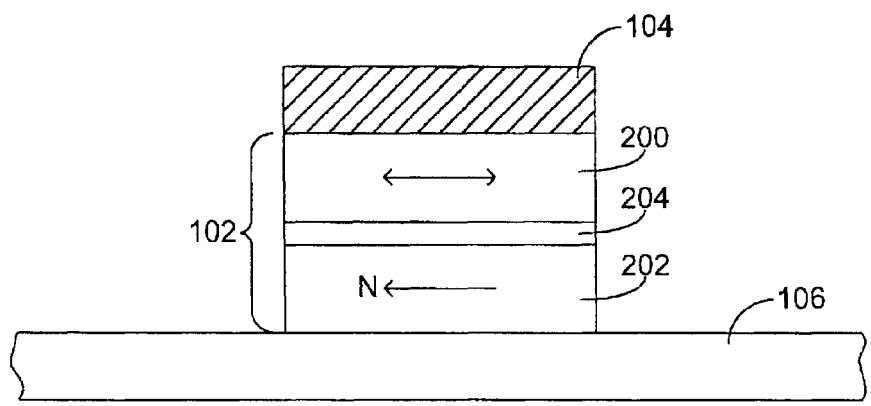
FIG. 2 is a side view of a memory cell of the magnetic memory device of FIG. 1.
Figure 3:
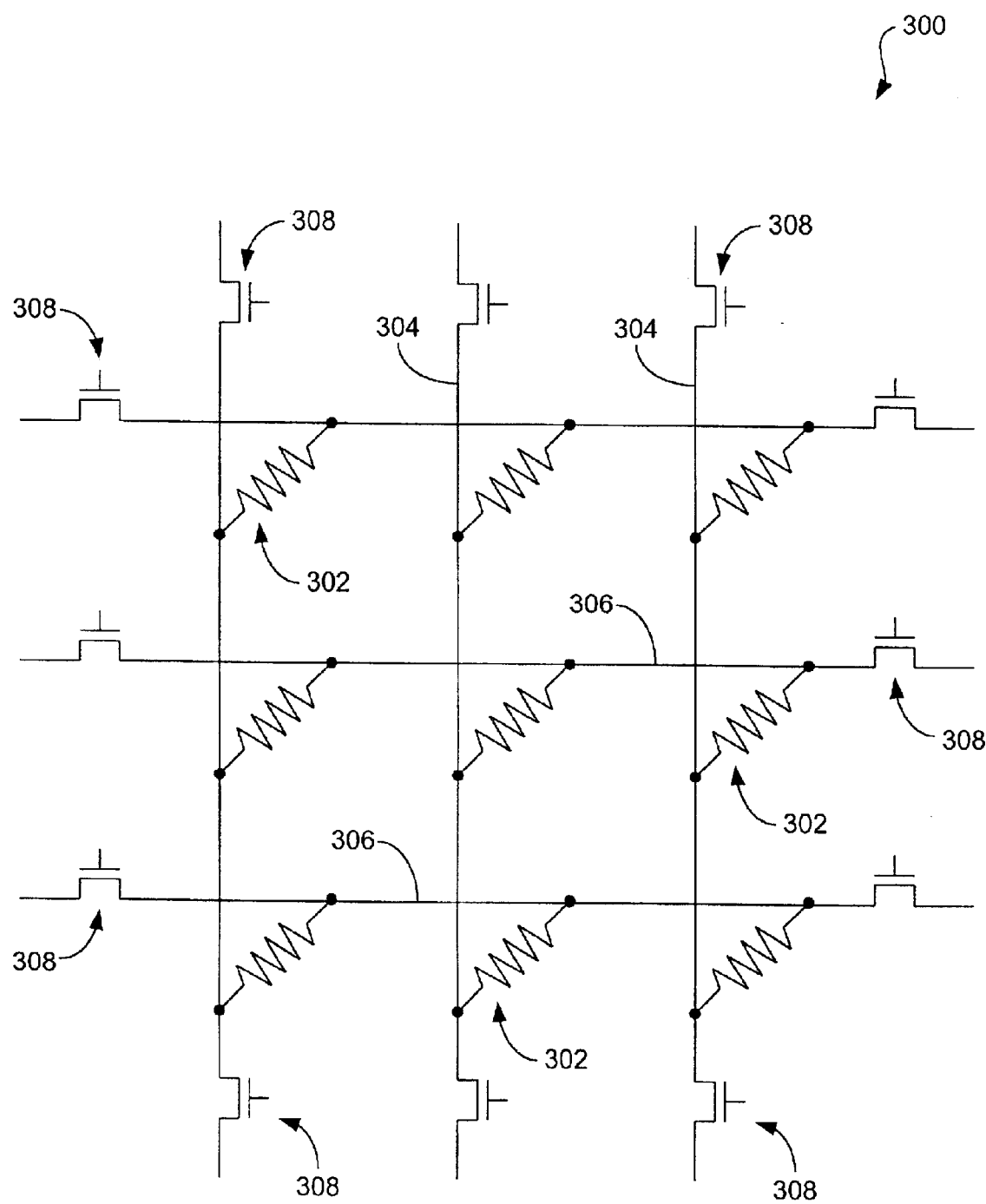
FIG. 3 is an electrical schematic representation of a switching arrangement for the magnetic memory device of FIG. 1.
Figure 4:
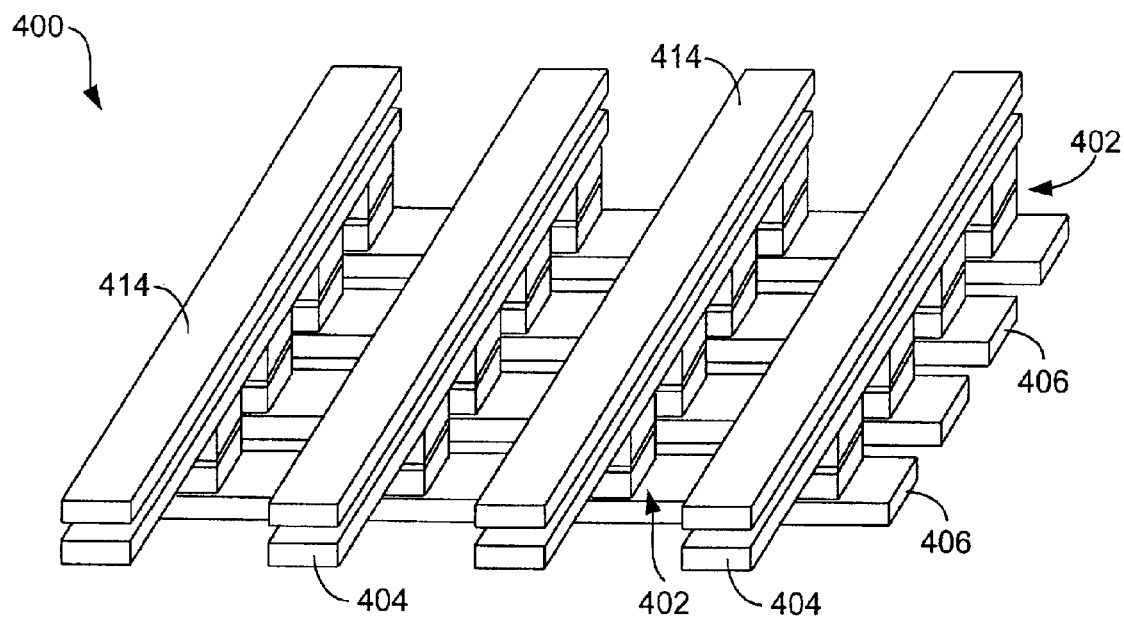
FIG. 4 is a schematic perspective view of a first magnetic memory device.
Figure 5:
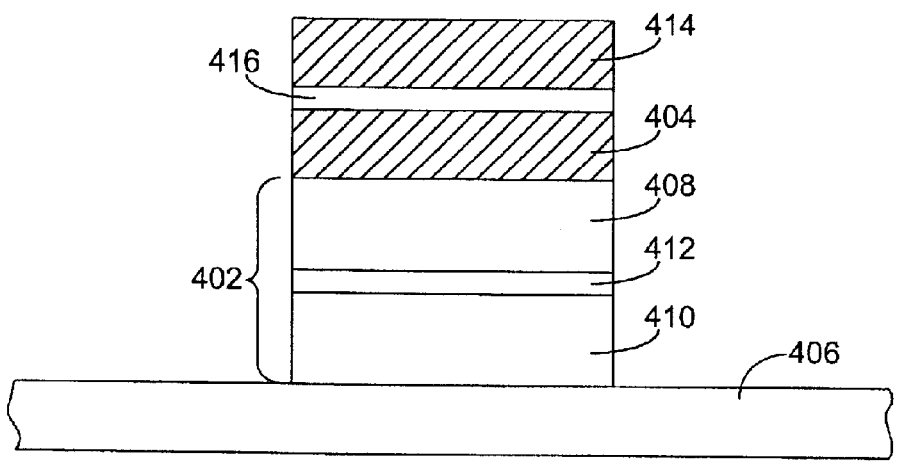
FIG. 5 is a side view of a memory cell of the magnetic memory device of FIG. 4.

Referring now to the drawings, in which like numerals indicate corresponding parts throughout the several views, FIGS. 4 and 5 illustrate a magnetic memory device 400, that, for instance, can comprise a magnetic random access memory (MRAM) device. The memory device 400 is typically formed as a semiconductor device that includes an array of memory cells 402. Although a limited number of memory cells 402 is depicted in FIG. 4, it is to be understood that only a few cells are shown as a representation of the memory cells of the device 400 to facilitate description of the device.

In addition to the memory cells 402, the magnetic memory device 400 includes a plurality of column and row conductors 404 and 406. As is discussed in more detail below, the column conductors 404 are only used for reading and therefore may be designated "bit" lines. As indicated in FIG. 4, each memory cell 402 of the array is electrically coupled to an associated column conductor 404 and row conductor 406 at a cross-point of the conductors. As shown in FIG. 5, each memory cell 402 comprises, for example, first and second magnetic layers 408 and 410, one of which is a fixed magnetic layer and the other of which is a free magnetic layer. By way of example, the top magnetic layer 408 can comprise the free magnetic layer and the bottom magnetic layer 410 comprises the fixed magnetic layer. Separating the two magnetic layers 408, 410 is a thin insulation layer 412 that functions as a tunnel barrier. With this arrangement, the memory cell 402 behaves as a magnetic tunnel junction (MTJ). Although a MTJ arrangement is shown and described herein, persons having ordinary skill in the art will appreciate that other arrangements are possible. For example, the memory cells can comprise giant magnetoresistive (GMR) elements, if desired.

Further included in the magnetic memory device 400 is a layer of write conductors 414 that, as indicated in the figures, extend parallel to but are separated from the column conductors 404. Typically, the write conductors 414 are separated from the column conductors 404 by a thin insulation layer 416, as indicated in FIG. 5. As is discussed in greater detail below, the write conductors 414 are only used during writing.

Figure 6:
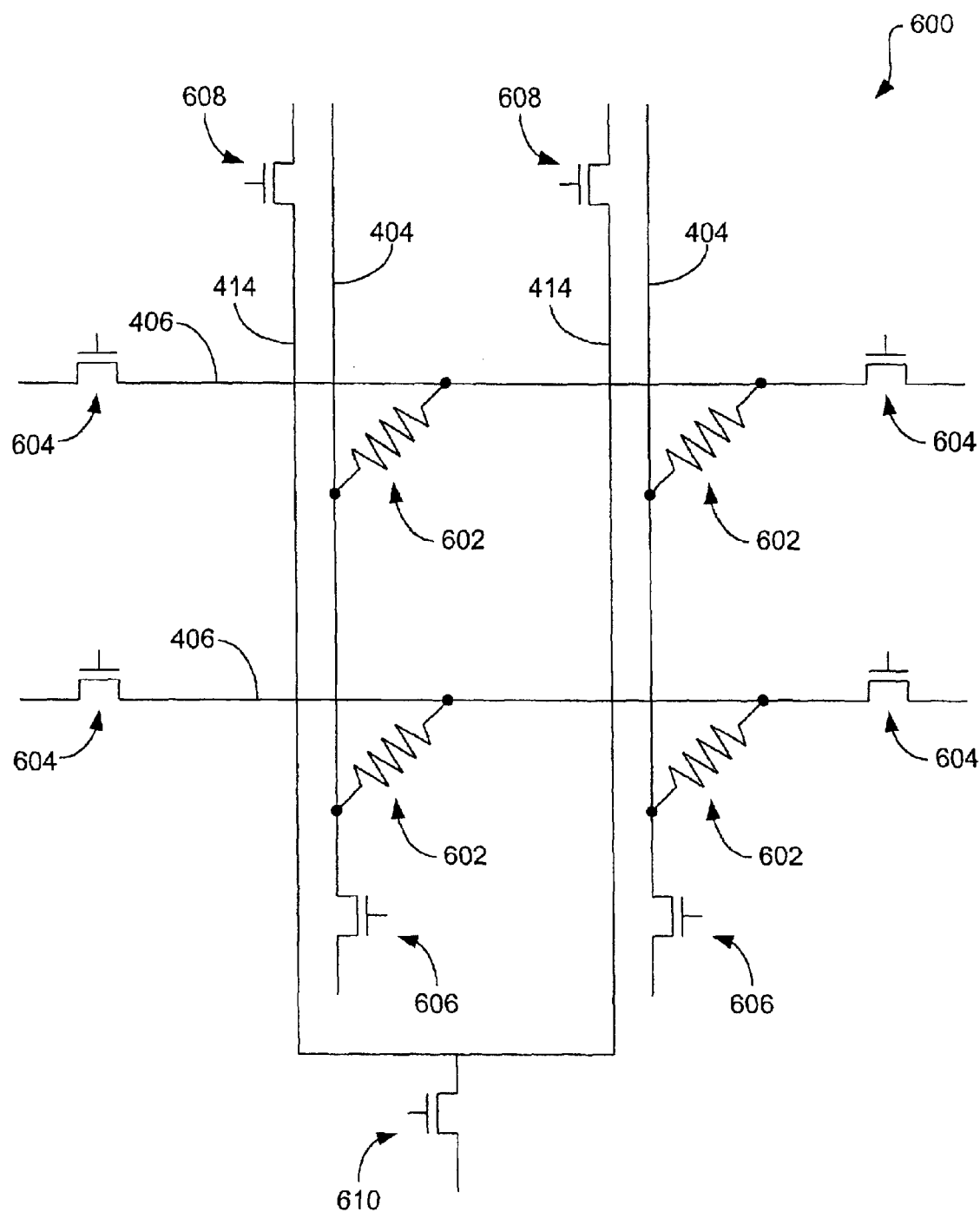
FIG. 6 is an electrical schematic representation of a switching arrangement of the magnetic memory device shown in FIG. 4.

FIG. 6 illustrates a switching arrangement 600 for the magnetic memory device 400 shown in FIG. 4. Four memory cells are represented schematically in FIG. 6 by resistors 602. It will be appreciated that, like memory cells 402 of FIG. 4, these cells 602 are only representative of the many cells that the magnetic memory device 400 comprises. Each of the memory cells 602 is electrically coupled to a column conductor 404 and row conductor 406, but is electrically isolated from each write conductor 414.

As is further illustrated in FIG. 6, each of the row conductors 406 is provided with a read/write switch, for example transistor 604, at each of its ends as in known magnetic memory devices so that those conductors can be used for both writing to and reading from the memory cells 602. These transistors 604, as well as the others described below, comprise part of a control circuit (not identified) with which switching can be provided for the conductors. Although "transistors" have been explicitly identified herein, persons having ordinary skill in the art will appreciate that substantially any switch or other component capable of providing switching could be used.

Although two transistors 604 are provided for each row conductor 406, only a single read transistor 606 is required for each column conductor 404 in that the column conductors (i.e., bit lines) are only used for reading. With this arrangement, there are n read transistors 606 for n column conductors 404. In addition to the reduction in number of transistors, the read transistors 606 are substantially smaller in than the read/write transistors 604, for example by a factor of 100, and therefore require much less area.

Each write conductor 414 is provided with a write transistor 608 at one end that is used to select or unselect the conductor during writing. In that the write conductors 414 are electrically insulated from the memory cells 602, there is no danger of voltage breakdown of the memory cells 602 during writing. Accordingly, the voltage provided along the write conductors 414 can be greater than that normally used to write in known magnetic memory devices. For instance, voltages from approximately 1.0 volts to 5.0 volts can be provided to the write lines 414 during writing. This voltage increase permits significant reduction in the size of the write transistors 608 as well as an increase in the length of the write conductors 414. By way of example, the write transistors 608 can be approximately 80 times the size of the read transistors 606 (as compared to 100 times for read/write transistors 604).

Figure 7:
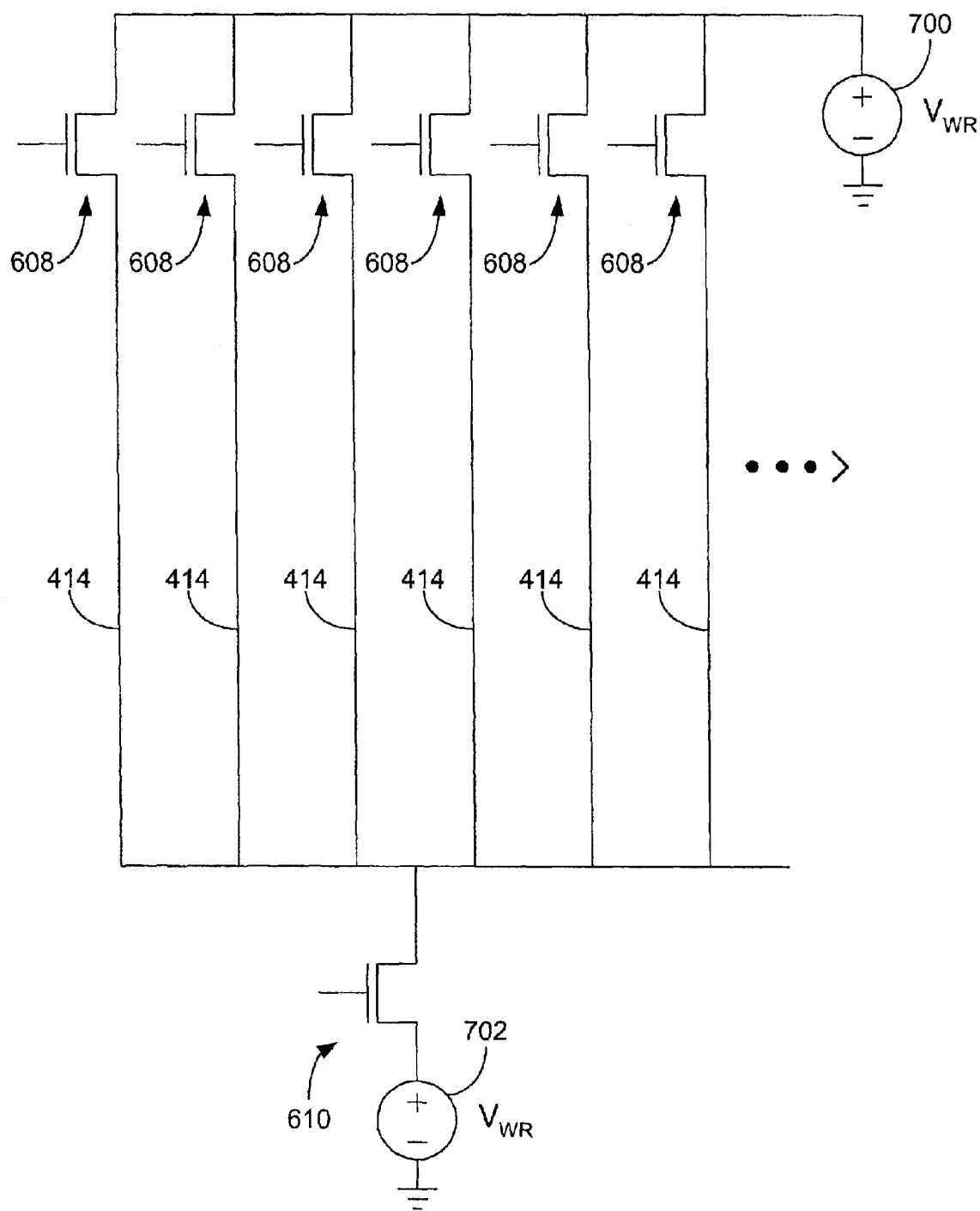
FIG. 7 is an electrical schematic of a comb conductor arrangement used in the switching arrangement of FIG. 6.

The reduction in number and size of the transistors noted above translates to substantial reduction in size, and therefore cost, of the magnetic memory device 400. Further space savings can be obtained by connecting each of the write conductors 414 to a single shared write transistor 610 at one end. This arrangement is possible in that the write conductors 414 are only used as a pathway for current that creates the electrical fields that change the orientation of the free magnetic layers of the memory cells 602. Accordingly, the transistors 608 can, for instance, be used to provide a write voltage, $V_{WR}$, to the write conductor 414, and the shared write transistor 610 can be used to tie the conductor, as well as the other write conductors, to ground to provide a path along which current can flow. FIG. 7 illustrates an example of this arrangement in isolation from the magnetic memory device. As shown in this example, the various conductors 414 can be arranged in a comb arrangement in which each includes its own transistor 608 at a first end that is coupled to a first write voltage source 700. In addition, each conductor (e.g., a thousand or more) can further be tied to a single shared write transistor 610 at a second end that, in turn, is connected to a second write voltage source 702. As will be appreciated by persons having ordinary skill in the art, two voltage sources are used to permit writing of both states of the memory cells (i.e., to permit current flows in both directions along conductors 414). With the arrangement of FIG. 7, the number transistors for the write conductors 414 can be reduced to (n+1) for n write conductors, thereby further reducing the size and cost of the magnetic memory device.

Referring back to FIG. 6, to write data to a memory cell 602, current is provided to the write conductor 414 and row conductor 406 associated with a particular memory cell 602. For instance, if it is desired to write to the upper left memory cell 602 illustrated in FIG. 6, a current is provided to the leftmost write conductor 414 and the topmost row conductor 406 simultaneously. The magnetic fields created by the flow of electrons through the conductors 414 and 406 cause the orientation of the free layer (e.g., layer 408 in FIG. 5) of the memory cell 602 to flip to, therefore, change the state of the cell.

The memory cells 602 can be read in variety of ways. In one example, the read conductor 404 and the row conductor 406 associated with each unselected memory cell 602 are provided with a reference voltage, $V_A$, and, simultaneously, one of the read conductors associated with the selected memory cell is connected to ground while the other associated conductor is provided with a read voltage, $V_A'$, which has a magnitude similar to the reference voltage, $V_A$. This switching permits current to flow through the selected memory cell 602 so that the resistance, and the logic value stored by the cell, can be determined. By way of example, this resistance can be determined using a transimpeadance amplifier (not shown).

Figure 8:
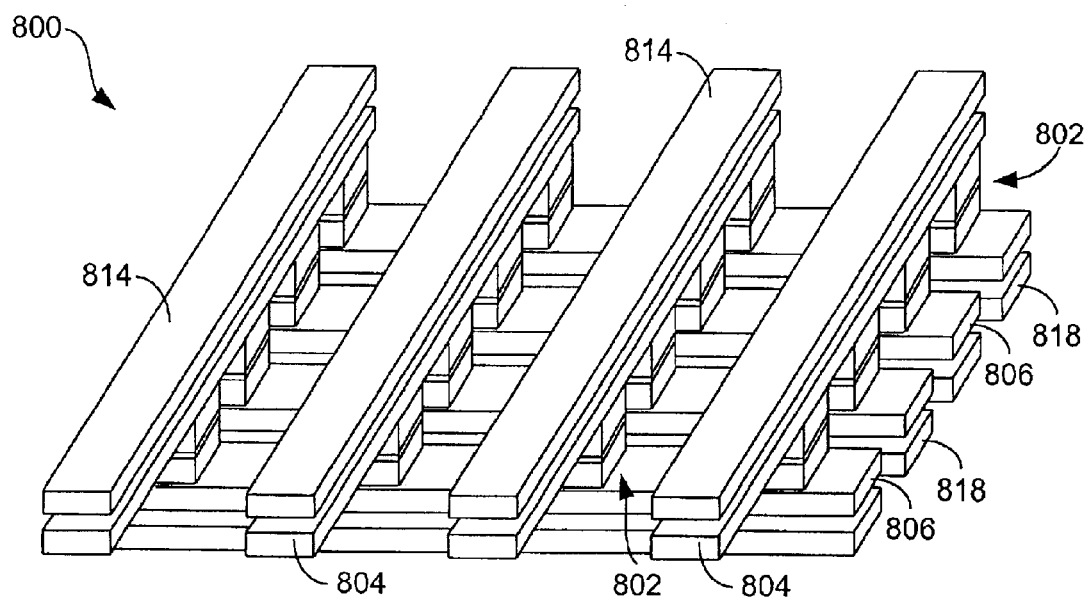
FIG. 8 is a schematic perspective view of a second magnetic memory device.
Figure 9:
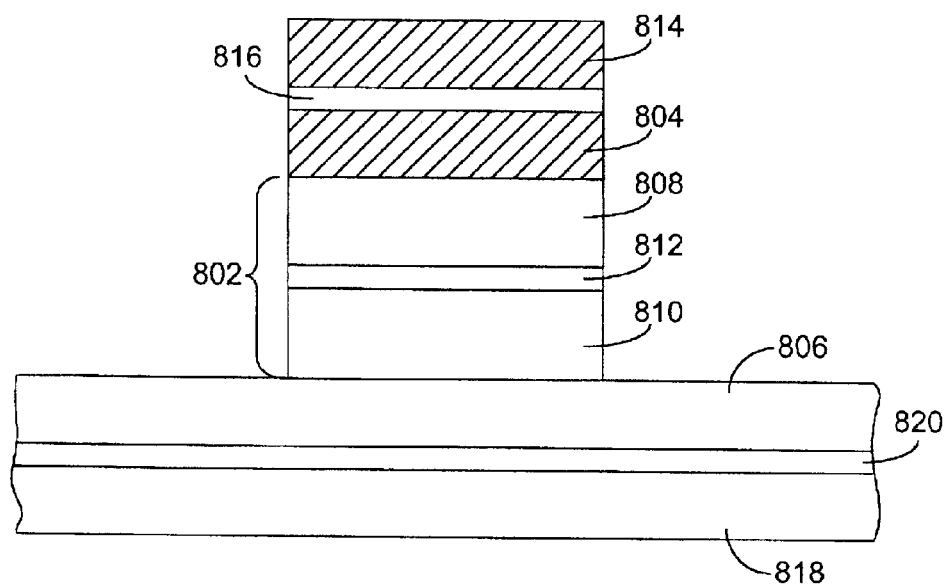
FIG. 9 is a side view of a memory cell of the magnetic memory device of FIG. 8.

FIGS. 8 and 9 illustrate a second magnetic memory device 800. In particular, FIG. 8 illustrates an array of memory cells 802, while FIG. 9 depicts a single memory cell, and its associated conductors, in detail. As with the embodiment shown in FIG. 4, although a limited number of memory cells is depicted in FIG. 8, it is to be understood that only a few representative of the many memory cells of the device 800 are shown to facilitate description of the device.

As with the magnetic memory device 400, the magnetic memory device 800 includes a plurality of column and row conductors 804 and 806. In the magnetic memory device 800, however, both the column conductors 804 and the row conductors 806 are only used for reading. As indicated in FIG. 9, each memory cell 802 comprises, for example, first and second magnetic layers 808 and 810, one of which is a fixed and one of which is free, the layers being separated by a thin insulation layer 812.

The magnetic memory device 800, like device 400, includes a layer of write conductors 814 that, as indicated in FIG. 9, is separated from the column conductors 804 by a thin insulation layer 816. Unlike magnetic memory device 400, however, the magnetic memory device 800 includes a second layer of write conductors 818 that, as indicated in the figures, extends parallel with and is separated from the row conductors 806. By way of example, this separation can be provided by a thin insulation layer 820, as shown in FIG. 9. In most embodiments, particularly those in which the magnetic layer 808 is the free magnetic layer, the thickness of the row conductor 806 and the insulation layer 820 are kept very small in that the magnetic fields, including those generated by the write conductor 818 during writing, decrease with the square of distance from the source.

Figure 10:
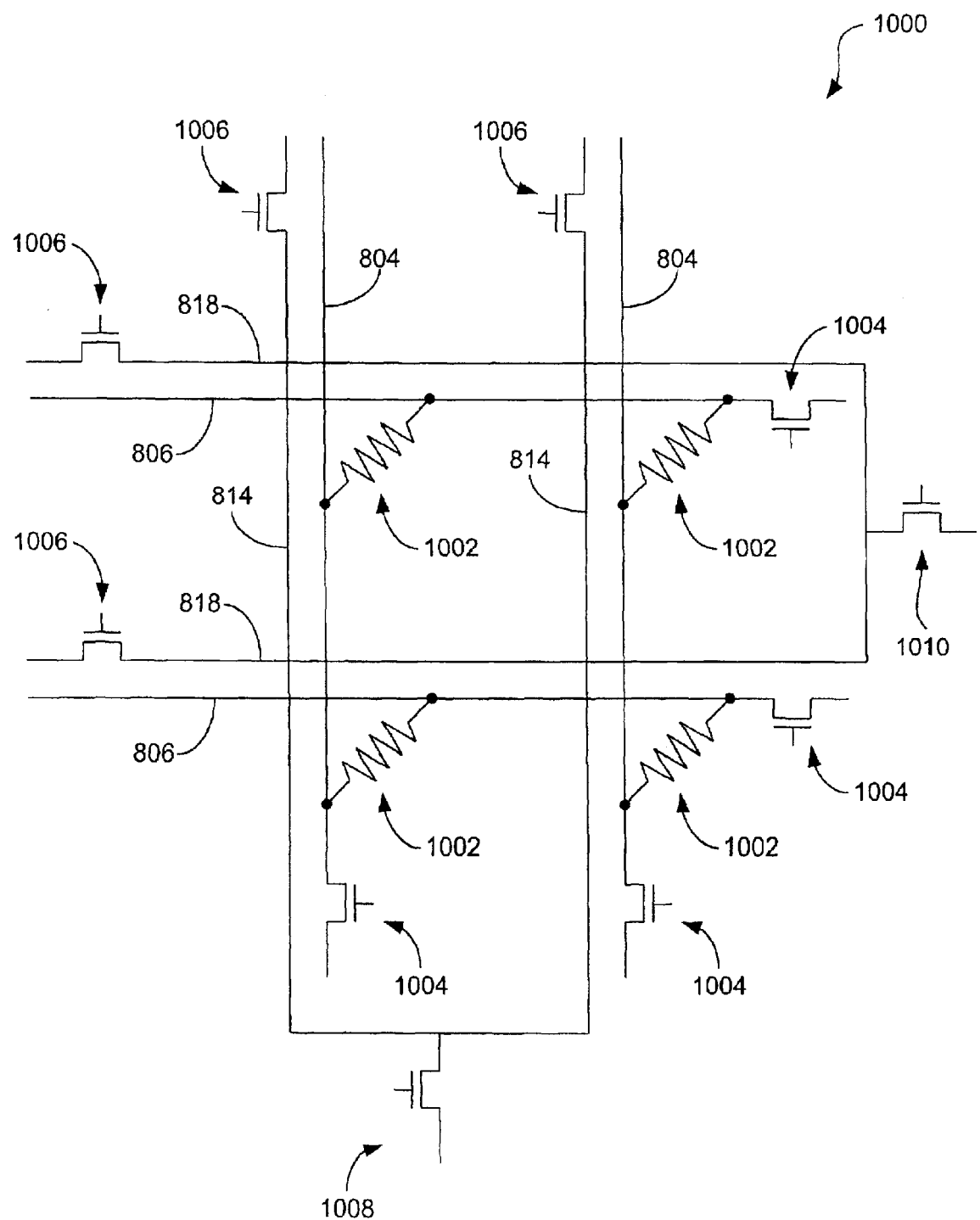
FIG. 10 is an electrical schematic representation of a switching arrangement of the magnetic memory device shown in FIG. 8.

FIG. 10 illustrates a switching arrangement 1000 for the magnetic memory device 800. In this figure, four memory cells are represented schematically by resistors 1002. Each of these memory cells 1002 is electrically coupled to a column conductor 804 and row conductor 806, which are only used for reading. These conductors 804, 806 may be designated "bit" and "word" lines, respectively. As shown in FIG. 10, the write lines 814 and 818 are electrically isolated from the memory cells 1002.

As in the previous embodiment described in relation to FIGS. 4–6, each column conductor (i.e., bit line) 804 only requires a single read transistor 1004 such that there are n read transistors 1004 for n column conductors, and each write conductor 814 is provided with its own write transistor 1006 at one end and is tied to a single shared write transistor 1008 at the other end such that there are (n+1) write transistors for n write conductors. In addition, however, due to the provision of the write conductors 818, each row conductor (i.e., word line) 806 similarly only requires a single read transistor 1004 such that there are n read transistors 1004 for n row conductors, and each write conductor 818 is provided with its own write transistor 1006 at one end and is tied to a single shared write transistor 1008 at the other end such that there are (n+1) write transistors for n write conductors along the row direction.

Reading and writing can be accomplished in similar manner as with the magnetic memory device 400 described above. However, with the device 800 of FIGS. 8–10, writing can be achieved using the electrically insulated write conductors 814 and 818, which together generate the magnetic fields required to change the state of the memory cells, and all reading is achieved using the read conductors 804 and 806.

As is apparent from the foregoing, even greater space, and therefore cost, savings can be attained with the arrangement illustrated in FIGS. 8–10. Although incremental cost is added for the addition of a further layer of conductors, the savings afforded by the reduced control circuit components far exceed the costs associated with the provision of an extra layer of conductors. In addition, the arrangement shown in FIGS. 8–10 further avoids the current spread effect in which current is shared with unselected memory cells during writing in that each of the write conductors 814, 818 is electrically isolated from the memory cells.

While particular embodiments of the invention have been disclosed in detail in the foregoing description and drawings for purposes of example, it will be understood by those skilled in the art that variations and modifications thereof can be made without departing from the scope of the invention as set forth in the following claims.

What is claimed is:

1. A magnetic memory device, comprising:
    a plurality of memory cells; and
    a plurality of write conductors adjacent the memory cells but electrically isolated from the memory cells, at least two of the write conductors being connected to a single shared switch, wherein the write conductors are configured to provide a path for current to flow to thereby generate magnetic fields used to change a state of the memory cells.

2. The memory device of claim 1, wherein each memory cell comprises a free magnetic layer and a fixed magnetic layer.

3. The memory device of claim 1, wherein each write conductor is connected to the single shared switch.

4. The memory device of claim 3, wherein each write conductor is connected to its own separate switch.

5. The memory device of claim 4, wherein each of the switches comprises a transistor.

6. The memory device of claim 1, further comprising a layer of read conductors positioned between the write conductors and the memory cells, the read conductors being electrically coupled to the memory cells and configured to deliver read current to the memory cells.

7. The memory device of claim 1, further comprising a layer of write conductors provided on an opposite side of the memory cells, the write conductors of the layer being electrically isolated from the memory cells, at least two of the write conductors of the layer being connected to a second single shared switch, wherein the write conductors of the layer are configured to provide a path for current to flow to thereby generate magnetic fields used to change a state of the memory cells.

8. A magnetic memory device, comprising:
    a plurality of memory cells arranged in a two dimensional array;
    a plurality of read/write conductors that are electrically coupled to the memory cells on a first side of the memory cells, the read/write conductors being configured to provide magnetic fields for the memory cells during writing and current flow to the memory cells during reading;
    a plurality of read conductors that are electrically coupled to the memory cells on a second side of the memory cells, the read conductors being configured to provide current flow to the memory cells during reading; and
    a plurality of write conductors adjacent the read conductors and electrically isolated from the memory cells, at least two of the write conductors being connected to a single shared transistor, wherein the write conductors are configured to generate magnetic fields for the memory cells during writing.

9. The memory device of claim 8, wherein each memory cell comprises a free magnetic layers and a fixed magnetic layer.

10. The memory device of claim 8, wherein each write conductor is connected to the single shared transistor.

11. The memory device of claim 8, wherein each write conductor is connected to its separate transistor.

12. A magnetic memory device, comprising:
    a plurality of memory cells arranged in a two dimensional array;
    a first layer of read conductors that are electrically coupled to the memory cells on a first side of the memory cells, the read conductors being configured to provide read current to the memory cells;
    a first layer of write conductors adjacent the first layer of read conductors and electrically isolated from the memory cells, at least two of the write conductors being connected to a first shared transistor, wherein the write conductors are configured to generate magnetic fields for the memory cells;
    a second layer of re conductors that are electrically coupled to the memory cells on a second side of the memory cells; and
    a second layer of write conductors adjacent the second layer of read conductors and electrically isolated from the memory cells, at least two of the write conductors of the second layer being connected to a second shared transistor, wherein the write conductors of the second layer are configured to generate magnetic fields for the memory cells.

13. The memory device of claim 12, wherein each memory cell comprises a free magnetic layer and a fixed magnetic layer.

14. The memory device of claim 12, wherein each write conductor of the first layer is connected to the first shared transistor and each write conductor of the layer is connected to the second shared transistor.

15. The memory device of claim 12, wherein each write conductor is connected to its own separate transistor.

16. A magnetic memory device, comprising:

a plurality of memory veils; and n write conductors, n being a positive integer, the n write conductors being positioned adjacent the memory cells but electrically isolated from the memory cells, the n write conductors being connected to (n+1) number of write transistors such that each write conductor comprises its own separate conductor and is further connected to a shared transistor.

17. The memory device of claim 16, further comprising a layer of read conductors positioned between the write conductors and the memory cells, each read conductor comprising its own read transistor.

18. A method for writing data to a memory cell of a magnetic memory device, comprising:

providing a write voltage to a first end of a write conductor of the magnetic memory device with a first transistor, the write conductor being electrically isolated from the memory cell;

connecting a second end of the write conductor to ground with a second transistor that is connected to at least one other write conductor of the magnetic memory device to create a first current path and a first magnetic field; and providing a write voltage to a separate conductor also connected to ground to create a second current path and a second magnetic field;

wherein the first and second fields together change a state of the memory cell.

19. The method of claim 18, wherein the step of providing a write voltage to a separate conductor comprises providing a first end of a separate write conductor with a third transistor, the write conductor being electrically isolated from the memory cell, and connecting a second end of the separate write conductor to ground with a fourth transistor that is connected to at least one other write conductor of the magnetic memory device to create the second current path and second magnetic field.

* * * * *